United States Patent
Tanaka

(10) Patent No.: US 11,728,396 B2
(45) Date of Patent: Aug. 15, 2023

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Akihiro Tanaka, Himeji Hyogo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 255 days.

(21) Appl. No.: 17/016,024

(22) Filed: Sep. 9, 2020

(65) Prior Publication Data
US 2021/0288154 A1    Sep. 16, 2021

(30) Foreign Application Priority Data
Mar. 16, 2020    (JP) .................. 2020-045514

(51) Int. Cl.
*H01L 29/45*    (2006.01)
*H01L 29/417*    (2006.01)
*H01L 27/088*    (2006.01)

(52) U.S. Cl.
CPC ...... *H01L 29/41725* (2013.01); *H01L 27/088* (2013.01); *H01L 29/45* (2013.01)

(58) Field of Classification Search
CPC ........... H01L 29/41741; H01L 29/7813; H01L 29/4236; H01L 29/7395; H01L 29/0696
See application file for complete search history.

(56) References Cited

U.S. PATENT DOCUMENTS

| | | | | |
|---|---|---|---|---|
| 9,263,572 | B2* | 2/2016 | Kawashiri | H01L 29/42376 |
| 10,121,888 | B2* | 11/2018 | Togami | H01L 29/0886 |
| 10,355,124 | B1* | 7/2019 | Asahara | H01L 29/0615 |
| 10,418,336 | B2* | 9/2019 | Iwamizu | H01L 21/76843 |
| 10,546,952 | B2* | 1/2020 | Togami | H01L 24/05 |
| 10,727,332 | B2* | 7/2020 | Kojima | H01L 29/4236 |
| 10,749,024 | B2* | 8/2020 | Tanaka | H01L 29/4238 |
| 10,777,475 | B2* | 9/2020 | Fukuchi | H01L 23/28 |
| 11,056,563 | B2* | 7/2021 | Yasuda | H01L 23/13 |
| 11,069,783 | B2* | 7/2021 | Yasuda | H01L 21/768 |
| 11,171,216 | B2* | 11/2021 | Asahara | H02J 7/0029 |

(Continued)

FOREIGN PATENT DOCUMENTS

| | | |
|---|---|---|
| JP | 2010-239018 A | 10/2010 |
| JP | 2015-162534 A | 9/2015 |

(Continued)

*Primary Examiner* — Mounir S Amer
*Assistant Examiner* — Alexander Belousov
(74) *Attorney, Agent, or Firm* — Kim & Stewart LLP

(57) ABSTRACT

A semiconductor device includes a semiconductor part including a first surface, a second surface, a first region provided between the first surface and the second surface, and a second region provided between the first surface and the second surface; a common electrode provided at the second surface; a first electrode provided on the first surface at the first region; a second electrode provided on the first surface at the second region and separated from the first electrode; a first control electrode provided in the first region; and a second control electrode provided in the second region. A first trench is provided in the common electrode.

19 Claims, 4 Drawing Sheets

(56) References Cited

U.S. PATENT DOCUMENTS

| | | | |
|---|---|---|---|
| 11,217,688 B2* | 1/2022 | Kojima | H01L 21/288 |
| 2007/0215938 A1* | 9/2007 | Yanagida | H01L 29/7397 |
| | | | 257/E29.198 |
| 2015/0084123 A1* | 3/2015 | Kawashiri | H01L 29/4236 |
| | | | 257/330 |
| 2018/0090611 A1* | 3/2018 | Togami | H01L 27/0207 |
| 2018/0269163 A1* | 9/2018 | Iwamizu | H01L 29/66734 |
| 2018/0331005 A1* | 11/2018 | Fukuchi | H03K 17/6874 |
| 2019/0051746 A1* | 2/2019 | Togami | H01L 24/03 |
| 2019/0074359 A1* | 3/2019 | Hashizume | H01L 29/7813 |
| 2019/0088749 A1* | 3/2019 | Asahara | H02J 7/0029 |
| 2019/0157403 A1* | 5/2019 | Yasuda | H01L 29/7813 |
| 2019/0296148 A1* | 9/2019 | Tanaka | H01L 27/0207 |
| 2019/0393334 A1* | 12/2019 | Weyers | H01L 23/34 |
| 2020/0083367 A1* | 3/2020 | Kojima | H01L 27/1203 |
| 2021/0036113 A1* | 2/2021 | Yasuda | H01L 29/7804 |
| 2021/0036114 A1* | 2/2021 | Yasuda | H01L 29/7813 |
| 2021/0074844 A1* | 3/2021 | Kojima | H01L 29/7809 |
| 2021/0288154 A1* | 9/2021 | Tanaka | H01L 29/41741 |
| 2022/0085192 A1* | 3/2022 | Tanaka | H01L 29/7813 |

FOREIGN PATENT DOCUMENTS

| | | |
|---|---|---|
| JP | 2018-49974 A | 3/2018 |
| WO | 2017/094185 A1 | 6/2017 |
| WO | 2018/025839 A1 | 2/2018 |

* cited by examiner

SEMICONDUCTOR DEVICE

CROSS-REFERENCE TO RELATED APPLICATION

This application is based upon and claims the benefit of priority from Japanese Patent Application No. 2020-045514, filed on Mar. 16, 2020; the entire contents of which are incorporated herein by reference.

FIELD

Embodiments described herein relate generally to a semiconductor device.

BACKGROUND

A semiconductor device is known in which two transistors including electrically independent source electrodes are formed on one common semiconductor substrate, and the drains of both transistors are connected to each other by a common electrode (a back electrode).

DETAILED DESCRIPTION

Figure 1:
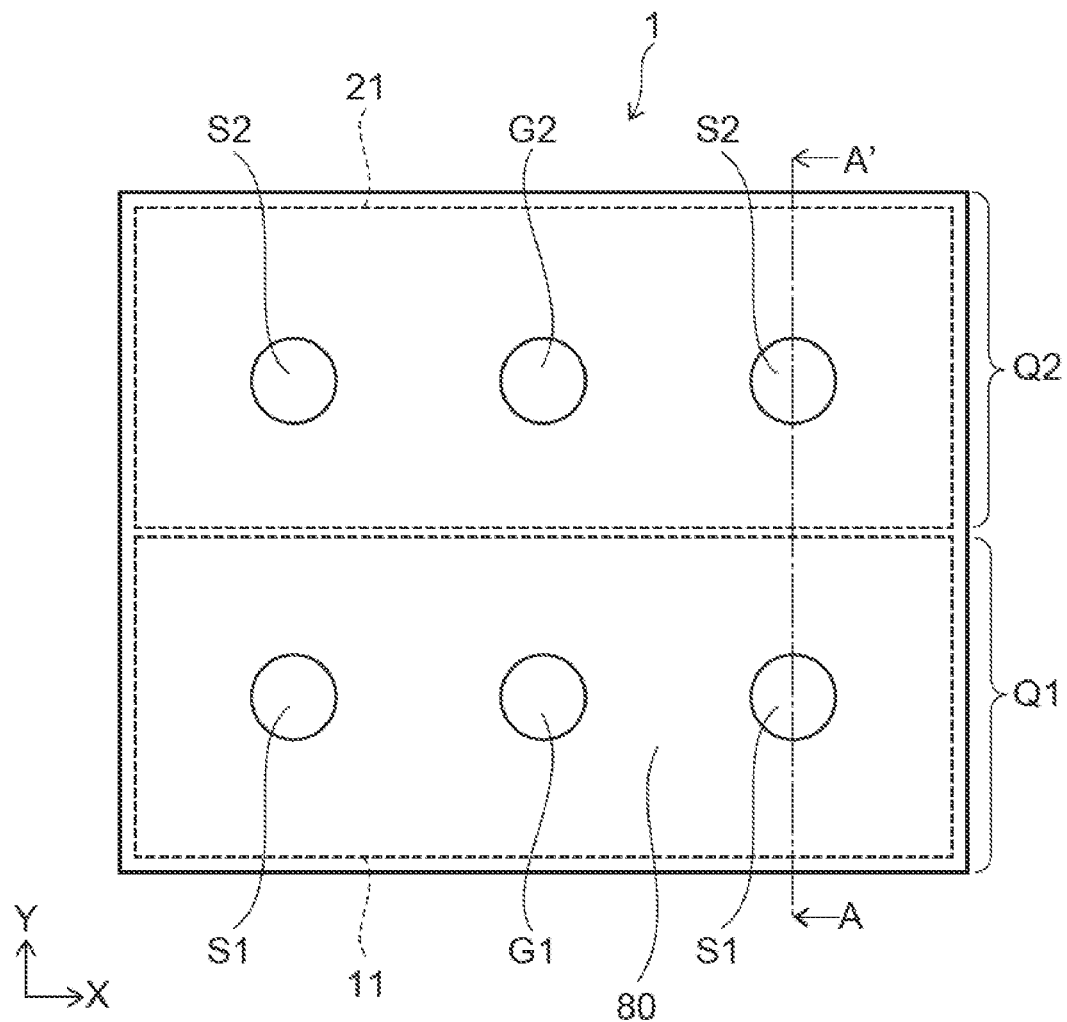
FIG. 1 is a schematic plan view of a semiconductor device of an embodiment.

According to one embodiment, a semiconductor device includes a semiconductor part including a first surface, a second surface, a first region provided between the first surface and the second surface, and a second region provided between the first surface and the second surface; a common electrode provided at the second surface; a first electrode provided on the first surface at the first region; a second electrode provided on the first surface at the second region and separated from the first electrode; a first control electrode provided in the first region, the first control electrode controlling a current flowing in the first region in a direction connecting the first electrode and the common electrode; and a second control electrode provided in the second region, the second control electrode controlling a current flowing in the second region in a direction connecting the second electrode and the common electrode. A first trench is provided in the common electrode.

Embodiments will now be described with reference to the drawings. The same components in the drawings are marked with the same reference numerals.

FIG. 1 is a schematic plan view of a semiconductor device 1 of an embodiment.

Figure 2:
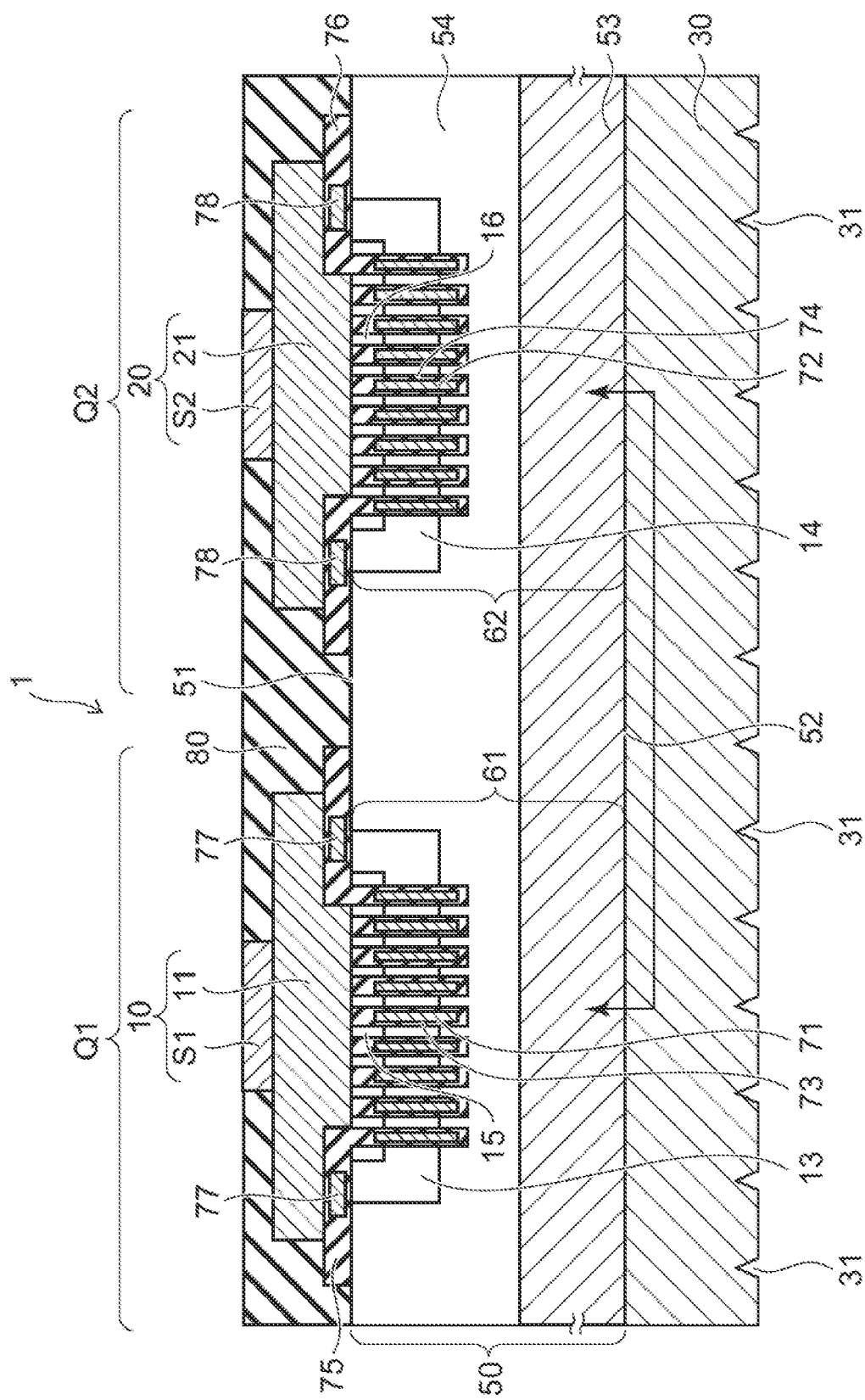
FIG. 2 is a line A-A' cross-sectional view of FIG. 1.

FIG. 2 is a line A-A' cross-sectional view of FIG. 1.

The semiconductor device 1 includes a semiconductor part 50, a common electrode 30, a first electrode 10, a second electrode 20, a first control electrode 71, and a second control electrode 72.

The semiconductor part 50 includes a semiconductor substrate 53, a first semiconductor layer 54 provided on the semiconductor substrate 53, a second semiconductor layer 13 and a third semiconductor layer 14 provided inside the first semiconductor layer 54, a fourth semiconductor layer 15 provided inside the second semiconductor layer 13, and a fifth semiconductor layer 16 provided inside the third semiconductor layer 14.

The semiconductor substrate 53 is, for example, an n-type silicon substrate. The first semiconductor layer 54 is, for example, an n-type silicon layer. The n-type impurity concentration of the first semiconductor layer 54 is less than the n-type impurity concentration of the semiconductor substrate 53. For example, the first semiconductor layer 54 is epitaxially grown on the semiconductor substrate 53.

The second semiconductor layer 13 and the third semiconductor layer 14 are, for example, p-type silicon layers. The first semiconductor layer 54 contacts the bottom surface and the side surface of the second semiconductor layer 13 and the bottom surface and the side surface of the third semiconductor layer 14.

The fourth semiconductor layer 15 and the fifth semiconductor layer 16 are, for example, n-type silicon layers. The n-type impurity concentrations of the fourth and fifth semiconductor layers 15 and 16 are greater than the n-type impurity concentration of the first semiconductor layer 54. The second semiconductor layer 13 contacts the bottom surface and the side surface of the fourth semiconductor layer 15. The third semiconductor layer 14 contacts the bottom surface and the side surface of the fifth semiconductor layer 16.

The front surface of the first semiconductor layer 54, the front surface of the second semiconductor layer 13, the front surface of the third semiconductor layer 14, the front surface of the fourth semiconductor layer 15, and the front surface of the fifth semiconductor layer 16 are included in a first surface 51 of the semiconductor part 50. The back surface of the semiconductor substrate 53 is included in a second surface 52 of the semiconductor part 50.

The semiconductor part 50 includes a first region 61 and a second region 62 between the first surface 51 and the second surface 52. The first region 61 and the second region 62 are adjacent to each other in a surface direction of the semiconductor part 50 (a direction parallel to the first surface 51 or the second surface 52).

The semiconductor substrate 53 and the first semiconductor layer 54 are provided commonly in the first region 61 and the second region 62. The second semiconductor layer 13 and the fourth semiconductor layer 15 are provided in the first region 61. The third semiconductor layer 14 and the fifth semiconductor layer 16 are provided in the second region 62.

Multiple first control electrodes 71 are provided in the first region 61. The first control electrode 71 is, for example, a trench gate and extends in the thickness direction of the semiconductor part 50 in the first region 61. The upper, side, and bottom surfaces of the first control electrode 71 are covered with an insulating film 73. The side surface of the first control electrode 71 faces the second semiconductor layer 13 via the insulating film 73.

Multiple second control electrodes 72 are provided in the second region 62. The second control electrode 72 is, for example, a trench gate and extends in the thickness direction of the semiconductor part 50 in the second region 62. The upper, side, and bottom surfaces of the second control electrode 72 are covered with an insulating film 74. The side surface of the second control electrode 72 faces the third semiconductor layer 14 via the insulating film 74.

Here, two directions orthogonal to each other in a plane parallel to the second surface 52 or the first surface 51 of the semiconductor part 50 are taken as an X-direction and a Y-direction in FIG. 1. The first control electrode 71 and the second control electrode 72 shown in FIG. 2 extend in the X-direction.

The first electrode 10 is provided on the first surface 51 in the first region 61 of the semiconductor part 50. The first electrode 10 includes a first metal portion 11 contacting the fourth semiconductor layer 15 at the first surface 51 of the semiconductor part 50, and a second metal portion S1 provided on the first metal portion 11.

The surface area of the first metal portion 11 is greater than the surface area of the second metal portion S1. The surface area of the first metal portion 11 refers to the surface area where the first metal portion 11 contacts the first surface 51 of the semiconductor part 50, or the surface area of the front surface (in FIG. 2, the upper surface) of the first metal portion 11. The surface area of the second metal portion S1 refers to the surface area of the front surface (in FIG. 2, the upper surface) of the second metal portion S1. In other words, the surface area of at least a portion of the first metal portion 11 in the X-Y plane is greater than the surface area of at least a portion of the second metal portion S1 in the X-Y plane.

For example, the first metal portion 11 includes mainly aluminum and functions as a contact layer that reduces the contact resistance with the semiconductor part 50. For example, a gold film that has excellent solder wettability is included at the outermost surface of the second metal portion S1. For example, a nickel film that increases the adhesion between the gold film and the first metal portion 11 is formed between the two.

A first interconnect layer 77 is provided on the first surface 51 in the first region 61 of the semiconductor part 50. The first interconnect layer 77 is electrically connected to the first control electrode 71. An insulating film 75 is provided between the first interconnect layer 77 and the first electrode 10 and between the first interconnect layer 77 and the semiconductor part 50.

The second electrode 20 is provided on the first surface 51 in the second region 62 of the semiconductor part 50. The second electrode 20 includes a third metal portion 21 that contacts the fifth semiconductor layer 16 at the first surface 51 of the semiconductor part 50, and a fourth metal portion S2 provided on the third metal portion 21.

The surface area of the third metal portion 21 is greater than the surface area of the fourth metal portion S2. The surface area of the third metal portion 21 refers to the surface area where the third metal portion 21 contacts the first surface 51 of the semiconductor part 50, or the surface area of the front surface (in FIG. 2, the upper surface) of the third metal portion 21. The surface area of the fourth metal portion S2 refers to the surface area of the front surface (in FIG. 2, the upper surface) of the fourth metal portion S2. In other words, the surface area of at least a portion of the third metal portion 21 in the X-Y plane is greater than the surface area of at least a portion of the fourth metal portion S2 in the X-Y plane.

For example, the third metal portion 21 includes mainly aluminum and functions as a contact layer that reduces the contact resistance with the semiconductor part 50. For example, a gold film that has excellent solder wettability is included at the outermost surface of the fourth metal portion S2. For example, a nickel film that increases the adhesion between the gold film and the third metal portion 21 is formed between the two.

A second interconnect layer 78 is provided on the first surface 51 in the second region 62 of the semiconductor part 50. The second interconnect layer 78 is electrically connected to the second control electrode 72. An insulating film 76 is provided between the second interconnect layer 78 and the second electrode 20 and between the second interconnect layer 78 and the semiconductor part 50.

An insulating film 80 is provided on the first surface 51 of the semiconductor part 50. The insulating film 80 covers the first metal portion 11 of the first electrode 10 and the third metal portion 21 of the second electrode 20. The insulating film 80 also covers the side surface of the second metal portion S1 of the first electrode 10 and the side surface of the fourth metal portion S2 of the second electrode 20. The front surface of the second metal portion S1 of the first electrode 10 and the front surface of the fourth metal portion S2 of the second electrode 20 are exposed from under the insulating film 80.

The common electrode 30 is provided at the second surface 52 of the semiconductor part 50 (the back surface of the semiconductor substrate 53). The common electrode 30 is provided commonly in the first region 61 and the second region 62 of the semiconductor part 50.

The common electrode 30 includes a metal having a lower resistivity than the semiconductor substrate 53. The common electrode 30 includes, for example, a silver film. The common electrode 30 also includes a titanium film provided between the silver film and the second surface 52 in contact with the second surface 52. The titanium film functions as a contact layer reducing the contact resistance with the semiconductor part 50. For example, a nickel film that increases the adhesion between the titanium film and the silver film can be provided between the two. For example, the common electrode 30 further includes a nickel film covering the front surface of the silver film. The nickel film that covers the front surface of the silver film prevents sulfidization due to exposure of the silver.

The thickness of the common electrode 30 is greater than the thickness of the first electrode 10 and the thickness of the second electrode 20. For example, the thickness of the common electrode 30 is about 12 μm, the thickness of the first electrode 10 is about 8 μm, and the thickness of the second electrode 20 is about 8 μm.

By the structure described above, the semiconductor device 1 includes a first transistor Q1 and a second transistor Q2 that share the common electrode 30 and the semiconductor substrate 53. The first transistor Q1 and the second transistor Q2 are adjacent to each other in the Y-direction. The first transistor Q1 and the second transistor Q2 are, for example, MOSFETs (Metal-Oxide-Semiconductor Field Effect Transistors).

The first electrode 10 functions as a source electrode of the first transistor Q1, and the fourth semiconductor layer 15 functions as a source layer electrically connected to the first electrode 10. When a prescribed voltage is applied to the first control electrode 71, a channel is induced in a portion of the second semiconductor layer 13 facing the first control electrode 71.

The second electrode 20 functions as a source electrode of the second transistor Q2, and the fifth semiconductor layer 16 functions as a source layer electrically connected to the second electrode 20. When a prescribed voltage is applied to the second control electrode 72, a channel is induced in a portion of the third semiconductor layer 14 facing the second control electrode 72.

The first electrode 10 and the second electrode 20 are separated from each other and insulatively isolated from each other. As illustrated by the broken lines in FIG. 1, the first metal portion 11 of the first electrode 10 spreads over substantially the entire surface of the region in which the first transistor Q1 is formed, and the third metal portion 21 of the second electrode 20 spreads over substantially the entire surface of the region in which the second transistor Q2 is formed.

For example, two second metal portions S1 are provided on the first metal portion 11 of the first electrode 10. For example, two fourth metal portions S2 are provided on the third metal portion 21 of the second electrode 20. The second metal portion S1 of the first electrode 10 and the fourth metal portion S2 of the second electrode 20 function as source pads performing electrical connections to an external circuit.

A first control pad G1 that is electrically connected to the first control electrode 71 via the first interconnect layer 77 is provided on the first surface 51 of the semiconductor part 50, and a second control pad G2 that is electrically connected to the second control electrode 72 via the second interconnect layer 78 is provided on the first surface 51 of the semiconductor part 50. The periphery of the first control pad G1 and the periphery of the second control pad G2 are covered with the insulating film 80, and the front surface of the first control pad G1 and the front surface of the second control pad G2 are exposed from under the insulating film 80.

For example, the semiconductor device 1 of the embodiment is used as a switch that is embedded in a charging/discharging circuit and controls the conduction of a bidirectional current for charging and discharging. The first transistor Q1 and the second transistor Q2 share the drain portion (the semiconductor substrate 53 and the common electrode 30); and the first electrode (the source electrode) 10 of the first transistor Q1 and the second electrode (the source electrode) 20 of the second transistor Q2 are connected to electrically independent terminals (to which different potentials are applied). A current flows between the first transistor Q1 and the second transistor Q2 via the common electrode 30. The current easily flows through the path of lower impedance and easily concentrates at the interface vicinity between the common electrode 30 and the semiconductor part 50.

Figure 5:
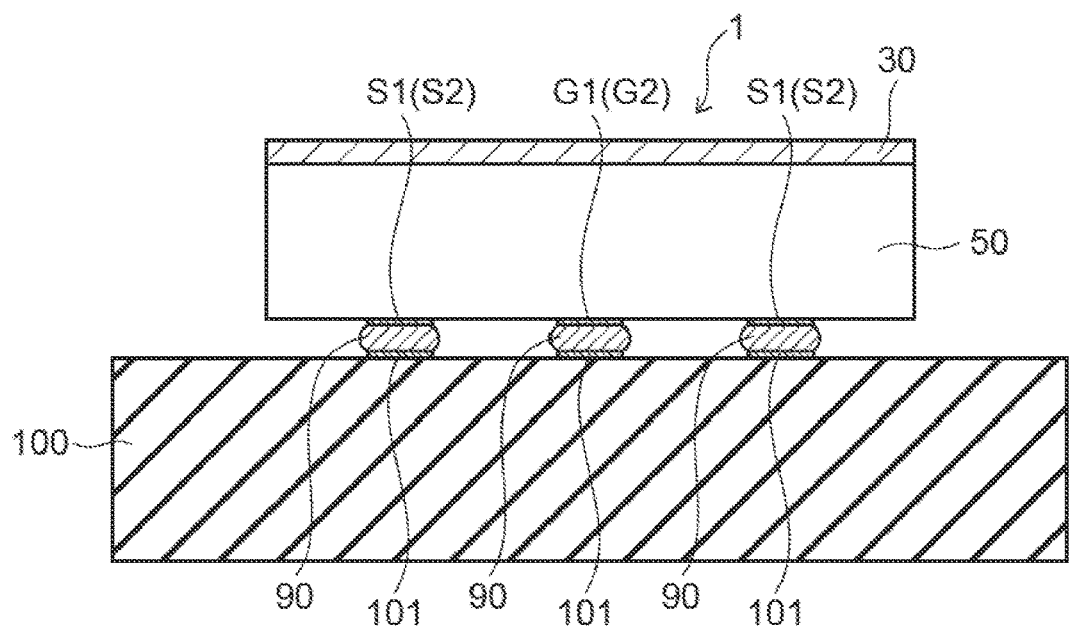
FIG. 5 is a schematic cross-sectional view of the semiconductor device of the embodiment mounted on a wiring substrate.

FIG. 5 is a schematic cross-sectional view of a state in which the semiconductor device 1 is mounted on a wiring substrate 100.

The semiconductor device 1 is mounted on the wiring substrate 100 in a state in which the common electrode 30 faces upward. The second metal portion S1, the fourth metal portion S2, the first control pad G1, and the second control pad G2 of the semiconductor device 1 are bonded to a conductor portion 101 of the wiring substrate 100 via a bonding member (e.g., solder) 90.

The linear expansion coefficients of the metals included in the common electrode 30, the first electrode 10, and the second electrode 20 are greater than the linear expansion coefficient of the semiconductor part 50; the metals undergo thermal expansion more easily than the semiconductor part 50. Distortion and/or warp may occur in the semiconductor device 1 due to the thermal expansion of the metals. Warp in the wafer state makes it difficult to singulate, and warp after singulation causes mounting defects on the wiring substrate 100. To suppress the warp, a thinner common electrode 30 is effective; however, there are constraints when making the common electrode 30 thinner due to the need to increase the cross-sectional area of the current path between the two transistors Q1 and Q2 and increase the common electrode 30 thickness in order to reduce the on-resistance.

According to the embodiment as shown in FIG. 2, multiple trenches 31 are formed in the common electrode 30. For example, the trenches 31 extend along the direction (the X-direction) in which the first control electrode 71 and the second control electrode 72 extend. Or, the trenches 31 may extend along a direction (the Y-direction) crossing the direction in which the first control electrode 71 and the second control electrode 72 extend. The first control electrode 71 and the second control electrode 72 may extend along the Y-direction. The trench 31 is a bottomed trench that has an opening at the surface of the common electrode 30 but does not extend through the common electrode 30. Accordingly, the conduction of the current between the two transistors Q1 and Q2 via the common electrode 30 is ensured.

By forming the trench 31 in the common electrode 30, the volume of the common electrode 30 can be partially reduced, an unevenness can be formed, and the warp due to the thermal expansion of the common electrode 30 can be partially relaxed. Thereby, the warp due to the thermal expansion of the common electrode 30 can be suppressed while reducing the on-resistance by making the common electrode 30 thicker.

Figure 3A:
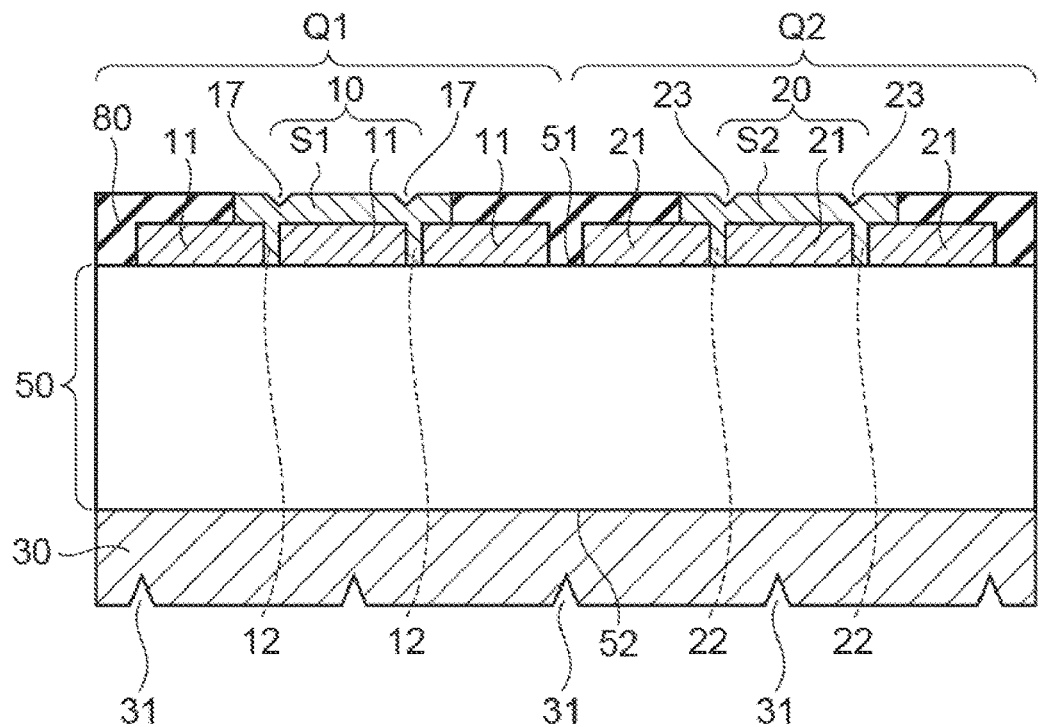
FIG. 3A and FIG. 3B are schematic cross-sectional views of a semiconductor device of another embodiment.

FIG. 3A is a schematic cross-sectional view of a semiconductor device of another embodiment.

The warp due to the thermal expansion of the metal at the first surface 51 side can be suppressed by forming trenches 12, 17, 22, and 23 in the first electrode 10 and the second electrode 20.

The through-trench 12 is formed in the first metal portion 11 of the first electrode 10. The through-trench 12 extends through the first metal portion 11 and divides the first metal portion 11 into multiple portions. A portion of the second metal portion S1 is formed inside the through-trench 12. The bottomed trench 17 is formed in the front surface of the second metal portion S1.

The through-trench 22 is formed in the third metal portion 21 of the second electrode 20. The through-trench 22 extends through the third metal portion 21 and divides the third metal portion 21 into multiple portions. A portion of the fourth metal portion S2 is formed inside the through-trench 22. The bottomed trench 23 is formed in the front surface of the fourth metal portion S2.

As described above with reference to FIG. 1, in the X-Y plane, the surface area of the first metal portion 11 is greater than the surface area of the second metal portion S1, and the surface area of the third metal portion 21 is greater than the surface area of the fourth metal portion S2. Accordingly, for the metal at the first surface 51 side (the first electrode 10 and the second electrode 20), the expansion of the first metal portion 11 and the third metal portion 21 has a greater effect on warp than the expansion of the second metal portion S1 and the fourth metal portion S2, and the division of the first metal portion 11 and the third metal portion 21 by the through-trenches 12 and 22 is effective to suppress the warp.

The bonding member 90 shown in FIG. 5 is provided at the front surface of the second metal portion S1 and the front surface of the fourth metal portion S2. By forming the trenches 17 and 23 in such a front surface of the second metal portion S1 and such a front surface of the fourth metal portion S2, the surface area where the bonding member 90 is bonded is increased, and the bonding strength with the bonding member 90 is increased.

Although the trenches 12, 17, 22, and 23 are formed in both the first electrode 10 and the second electrode 20 in the example of FIG. 3A, a trench may be formed in only one of the first electrode 10 or the second electrode 20.

Also, trenches may be formed in the first electrode 10 and the second electrode 20 without forming the trench 31 in the common electrode 30. However, as described above, it is desirable for the common electrode 30 to be thicker than the first electrode 10 and the second electrode 20 to reduce the on-resistance, and the effects of warp suppression are increased by forming the trench 31 in the common electrode 30, which is thicker than the first electrode 10 and the second electrode 20.

Figure 3B:
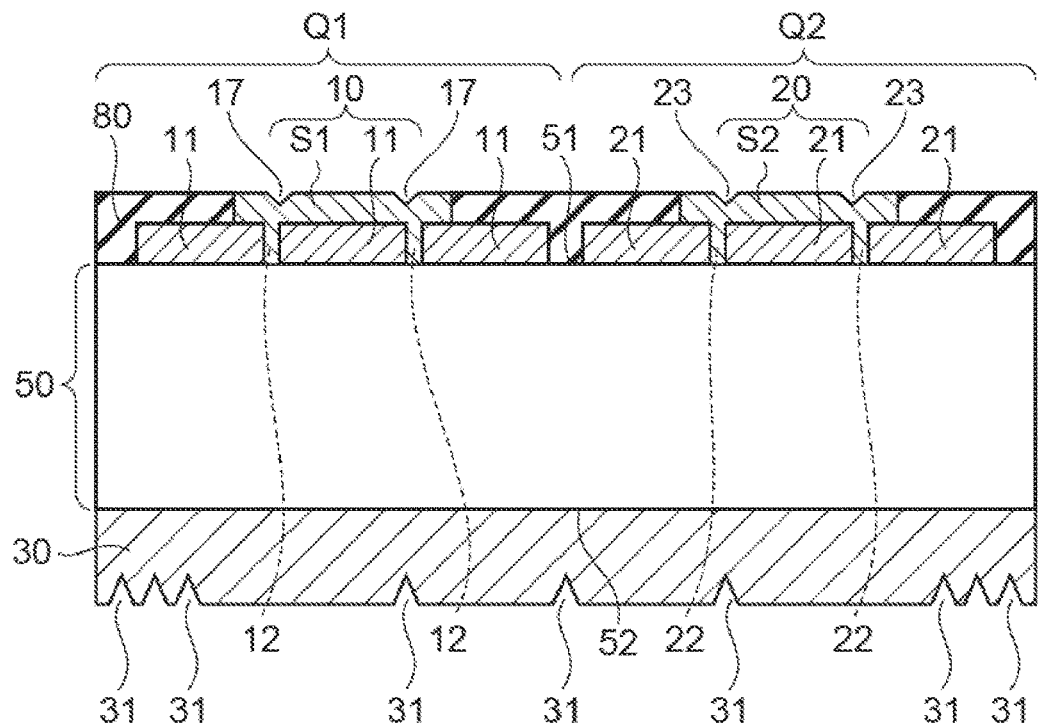

FIG. 3B is a schematic cross-sectional view of a semiconductor device of another embodiment.

The density of the trenches 31 formed in the common electrode 30 at the end portion of the semiconductor device is greater than the density of the trenches 31 formed in the common electrode 30 at the central portion of the semiconductor device (the region including the surface-direction center of the semiconductor device). Such a configuration increases the suppression effect of the warp of the semiconductor device due to the expansion of the common electrode 30.

Figure 4:
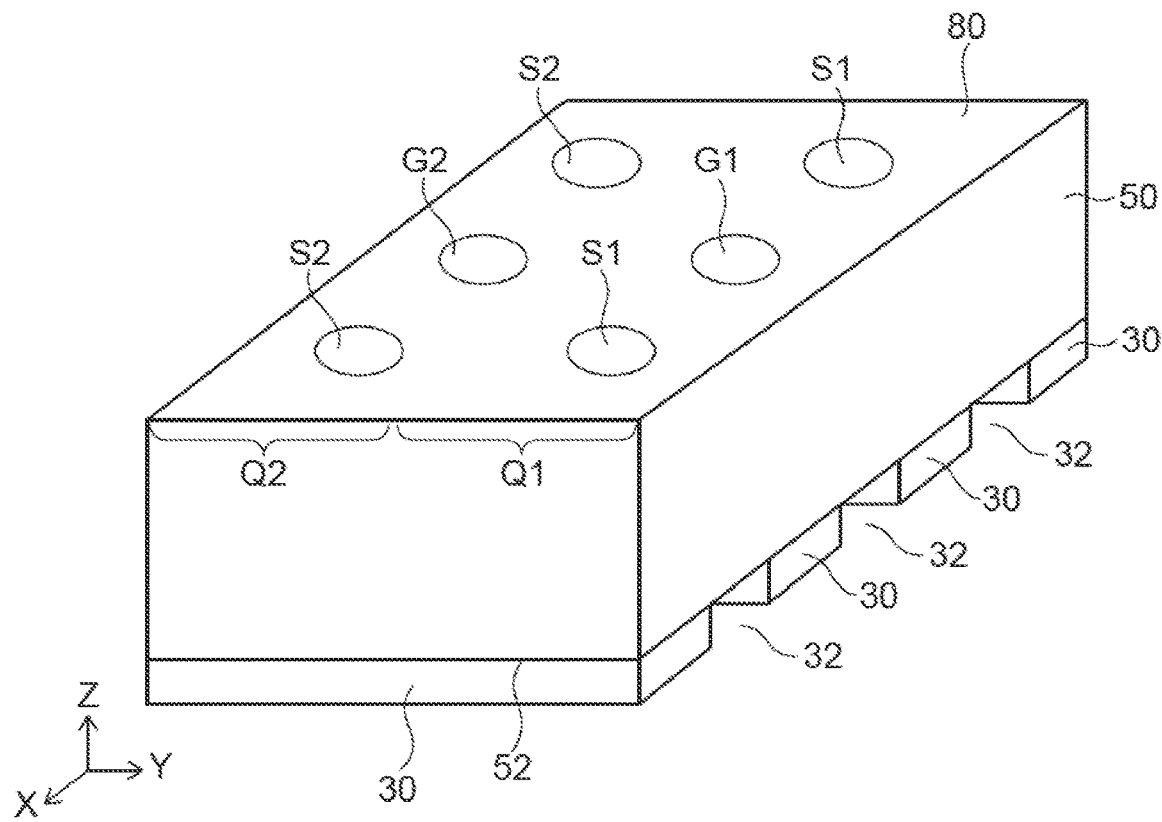
FIG. 4 is a schematic perspective view of a semiconductor device of another embodiment.

FIG. 4 is a schematic perspective view of a semiconductor device of another embodiment.

The X-direction and the Y-direction of FIG. 4 are the opposite of the X-direction and the Y-direction of FIG. 1. A direction that is orthogonal to the X-direction and the Y-direction along the thickness direction of the semiconductor part 50 is taken as a Z-direction.

A through-trench 32 is formed in the common electrode 30 provided at the second surface 52 of the semiconductor part 50. The through-trench 32 extends through the common electrode 30 and divides the common electrode 30 into multiple portions. The through-trench 32 extends along the Y-direction along which the first transistor Q1 and the second transistor Q2 are adjacent to each other. The common electrode 30 is divided in the X-direction. Accordingly, the conduction of the current between the first transistor Q1 and the second transistor Q2 via the common electrode 30 is ensured.

The n-conductivity type and the p-conductivity type of the semiconductor components described above may be reversed. Also, other than silicon, the material of the semiconductor part 50 may be silicon carbide or gallium nitride. The first control electrode 71 and the second control electrode 72 are not limited to trench gate structures, and may have planar-gate structures.

Although several embodiments of the invention are described, these embodiments are presented as examples and are not intended to limit the scope of the invention. These novel embodiments may be implemented in other various forms without departing from the spirit of the invention; and various omissions, substitutions, and modifications can be performed. Such embodiments and their modifications are within the scope and spirit of the invention and are included in the invention described in the claims and their equivalents.

While certain embodiments have been described, these embodiments have been presented by way of example only, and are not intended to limit the scope of the invention. Indeed, the novel embodiments described herein may be embodied in a variety of other forms; furthermore, various omissions, substitutions and changes in the form of the embodiments described herein may be made without departing from the spirit of the invention. The accompanying claims and their equivalents are intended to cover such forms or modification as would fall within the scope and spirit of the invention.

What is claimed is:

1. A semiconductor device, comprising:
a semiconductor part including a first surface, a second surface, a first region provided between the first surface and the second surface, and a second region provided between the first surface and the second surface;
a common electrode provided at the second surface, the common electrode being a metal electrode, the common electrode comprising a third surface and a fourth surface, the third surface being in contact with the second surface, the fourth surface opposing the third surface;
a first electrode provided on the first surface at the first region;
a second electrode provided on the first surface at the second region and separated from the first electrode;
a first control electrode provided in the first region, the first control electrode controlling a current flowing in the first region in a direction connecting the first electrode and the common electrode; and
a second control electrode provided in the second region, the second control electrode controlling a current flowing in the second region in a direction connecting the second electrode and the common electrode,
a plurality of first trenches each extending in a first direction through the common electrode,
the plurality of first trenches dividing the common electrode into separate sections in a second direction orthogonal to the first direction,
the semiconductor part not being provided in the plurality of first trenches,
a density of the plurality of first trenches in the second direction at an end portion of the device being greater than a density of the plurality first trenches in the second direction at a central portion of the device.

2. The device according to claim 1, wherein
a second trench is provided in at least one of the first electrode and the second electrode.

3. The device according to claim 2, wherein
the first electrode includes a first metal portion contacting the first surface, and a second metal portion provided on the first metal portion,
a surface area of the first metal portion is greater than a surface area of the second metal portion, and
the second trench is provided in at least the first metal portion.

4. The device according to claim 3, wherein
the first metal portion includes mainly aluminum.

5. The device according to claim 2, wherein
the second electrode includes a third metal portion contacting the first surface, and a fourth metal portion provided on the third metal portion,
a surface area of the third metal portion is greater than a surface area of the fourth metal portion, and
the second trench is provided in at least the third metal portion.

6. The device according to claim 5, wherein
the third metal portion includes mainly aluminum.

7. The device according to claim 1, wherein
a thickness of the common electrode is greater than a thickness of the first electrode and a thickness of the second electrode.

8. The device according to claim 1, wherein
the first control electrode extends in a thickness direction of the semiconductor part in the first region, and
the second control electrode extends in the thickness direction of the semiconductor part in the second region.

9. The device according to claim 1, wherein
the common electrode includes a silver film.

10. The device according to claim 1, wherein
the third surface is undivided.

11. The device according to claim 1, wherein
the third surface is a flat surface.

12. The device according to claim 1, wherein
an entirety of the third surface is in contact with the second surface.

13. A semiconductor device, comprising:
a semiconductor part including a first surface, a second surface, a first region provided between the first surface and the second surface, and a second region provided between the first surface and the second surface;
a common electrode provided at the second surface;
a first electrode provided on the first surface at the first region;
a second electrode provided on the first surface at the second region and separated from the first electrode;
a first control electrode provided in the first region, the first control electrode controlling a current flowing in the first region in a direction connecting the first electrode and the common electrode; and
a second control electrode provided in the second region, the second control electrode controlling a current flowing in the second region in a direction connecting the second electrode and the common electrode,
the first electrode including a first metal portion contacting the first surface, and a second metal portion provided on the first metal portion,
a surface area of the first metal portion being greater than a surface area of the second metal portion,
the second metal portion being provided in a first trench that extends through the first metal portion and divides the first metal portion into separate sections.

14. The device according to claim 13, wherein
the first metal portion includes mainly aluminum.

15. The device according to claim 13, wherein
the second electrode includes a third metal portion contacting the first surface, and a fourth metal portion provided on the third metal portion,
a surface area of the third metal portion is greater than a surface area of the fourth metal portion, and
the fourth metal portion is provided in a second trench that extends through the third metal portion and divides the third metal portion into separate sections.

16. The device according to claim 15, wherein
the third metal portion includes mainly aluminum.

17. The device according to claim 13, wherein
a thickness of the common electrode is greater than a thickness of the first electrode and a thickness of the second electrode.

18. The device according to claim 13, wherein
the first control electrode extends in a thickness direction of the semiconductor part in the first region, and
the second control electrode extends in the thickness direction of the semiconductor part in the second region.

19. The device according to claim 13, wherein
the common electrode includes a silver film.

* * * * *